(12) United States Patent
Gonidou

(10) Patent No.: US 11,577,860 B2
(45) Date of Patent: Feb. 14, 2023

(54) METHOD FOR ANALYZING A COUPLED VEHICLE/PASSENGER SYSTEM

(71) Applicant: CENTRE NATIONAL D'ETUDES SPATIALES, Paris (FR)

(72) Inventor: Luc-Olivier Gonidou, Baulne (FR)

(73) Assignee: CENTRE NATIONAL D'ETUDES SPATIALES, Paris (FR)

( * ) Notice: Subject to any disclaimer, the term of this patent is extended or adjusted under 35 U.S.C. 154(b) by 741 days.

(21) Appl. No.: 16/570,277

(22) Filed: Sep. 13, 2019

(65) Prior Publication Data

US 2020/0002029 A1 Jan. 2, 2020

Related U.S. Application Data

(63) Continuation of application No. PCT/EP2018/056421, filed on Mar. 14, 2018.

(30) Foreign Application Priority Data

Mar. 14, 2017 (FR) ...................... 1752085

(51) Int. Cl.
| | |
|---|---|
| *B64G 1/38* | (2006.01) |
| *B64G 1/60* | (2006.01) |
| *B64G 1/64* | (2006.01) |
| *G06F 17/16* | (2006.01) |

(52) U.S. Cl.
CPC ................. *B64G 1/38* (2013.01); *B64G 1/60* (2013.01); *B64G 1/64* (2013.01); *G06F 17/16* (2013.01)

(58) Field of Classification Search
CPC .... B64G 1/38; B64G 1/60; B64G 1/64; G06F 17/16
See application file for complete search history.

(56) References Cited

FOREIGN PATENT DOCUMENTS

CN 108038277 A * 5/2018 ............. G06F 17/16

OTHER PUBLICATIONS

Morand Prevision de l'ambiance vibratoire des satellites, 3E Colloque Tendances Actuelles en Calcul de structures, pp. 197-214, 1985 (Year: 1985).*

Yuan et al. Finite element model updating of damped structures using vibration test data under base excitation, Journal of Sound and Vibration, vol. 340, pp. 303-316, Elsevier Ltd., Dec. 2014 (Year: 2014).*

International Search Report for International Application PCT/EP2018/056421, dated May 15, 2018.

(Continued)

*Primary Examiner* — Justin M Benedik
(74) *Attorney, Agent, or Firm* — Burris Law, PLLC

(57) ABSTRACT

A method for determining, by reanalysis, a vibratory environment of a coupled vehicle/passenger system. A vehicle is subjected to external forces Fext and is coupled to a new passenger including multiple payloads (e.g., x=I, . . . N payload(s)). At the level of vehicle/passenger interfaces Ix, the method comprising a step DET1) for determining, based on reference interfacial acceleration $\gamma_{x\_ref}$ of a reference passenger, the interfacial acceleration $\gamma_x'$ relative to the new passenger.

7 Claims, 3 Drawing Sheets

(56) References Cited

OTHER PUBLICATIONS

Morand, Prevision de l'ambiance vibratoire des satellites, 3E Colloque Tendances Actuelles en Calcul de Structures, pp. 197-214, 1985.

Yuan, et al., Finite element model updating of damped structures using vibration test data under base excitation, Journal of Sound and Vibration, vol. 340, pp. 303-316, Elsevier Ltd., Dec. 2014.

Starc Blaz et al., A mixed-contact formulation for a dynamics simulation of flexible systems: An integration with model-reduction techniques, Journal of Sound and Vibration, vol. 393, pp. 145-156, Elsevier Ltd., Jan. 2017.

Liu et al., Parameter analysis of PAF for whole-spacecraft vibration isolation, Aerospace Science and Technology, vol. 11, Iss. 6, pp. 464-472, Elsevier Publishing, 2007.

De Klerk, D., et al., General Framework for Dynamic Substructuring: History, Review, and Classification of Techniques, AIAA Journal, vol. 46, Iss. 5, pp. 1169-1181, May 2008.

Dickens, J.M., et al., Coupled Loads Analysis Accuracy from the Space Vehicle Perspective, ACTA Astronautica, vol. 48, Iss. 1, pp. 21-28, Pergamon Press, Elmsford, GB, 2001.

Blelloch, et al., A Time Domain Approach for Spacecraft Reanalysis, pp. 2295-2306, American Institute of Aeronautics and Astronautics, Inc., 1992.

\* cited by examiner

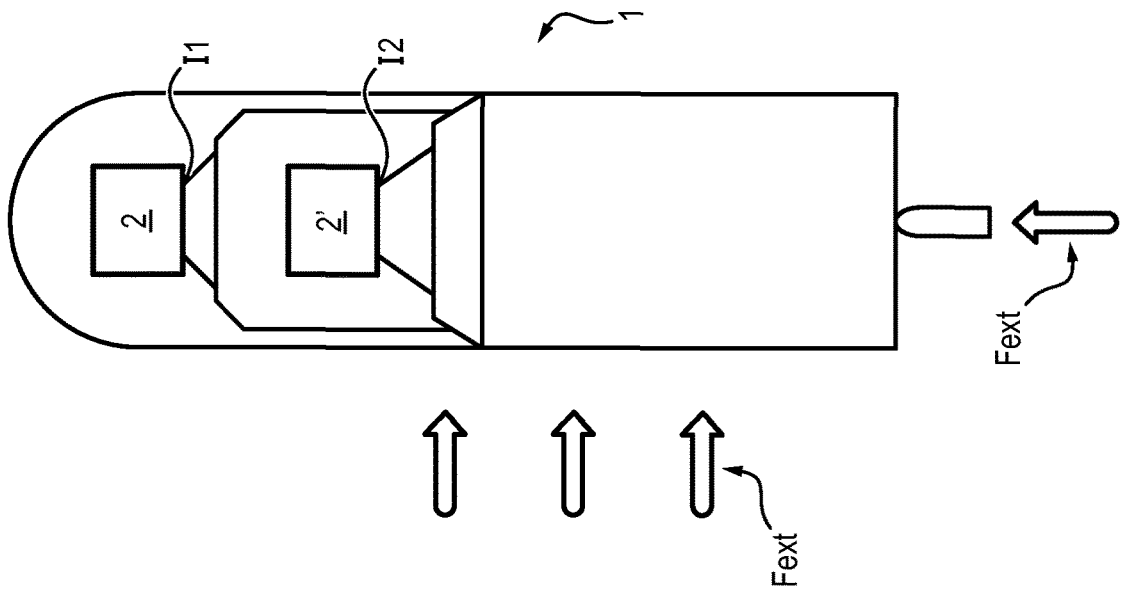
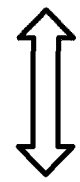
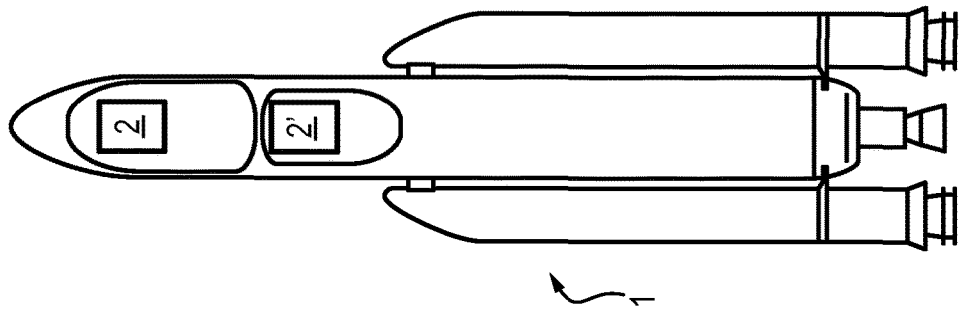

METHOD FOR ANALYZING A COUPLED VEHICLE/PASSENGER SYSTEM

CROSS-REFERENCE TO RELATED APPLICATIONS

This application is a continuation of International Application No. PCT/EP2018/056421, filed on Mar. 14, 2018, which claims priority to and the benefit of FR 17/52085, filed on Mar. 14, 2017. The disclosures of the above applications are incorporated herein by reference.

FIELD

The present disclosure relates to a method for calculating vibratory responses of a vehicle/passenger coupled system, the vehicle being in particular a space launcher adapted to carry one or several satellite(s). The external forces apply only on the vehicle.

BACKGROUND

The statements in this section merely provide background information related to the present disclosure and may not constitute prior art.

The analysis of a vehicle/passenger coupled system, such as a space launcher carrying a payload (one or several satellite(s)) in order to determine its vibratory behavior/ambient is desired during the development studies of a new launcher and during its operation phase.

In particular, during the launch, the launcher is subjected to severe external forces that can be damaging to the launcher or to the payloads.

Thus, depending on the payload, the vibratory responses of the launcher and of the payload are determined.

Obtaining these answers (i.e., analysis of vibratory behavior) is time-consuming and tedious knowing that these answers should be obtained for each payload before each launch.

In order to limit the calculation times, an analysis method implementing a reanalysis is used. In particular, it consists in determining a vibratory ambient of the launcher and a reference payload and, from these obtained responses, determining the vibratory ambient of the pair: other payload and launcher. The launcher being identical, the payload not. The reference vibratory ambient is determined in a standard manner.

Such a method is described in the document: P. A. Blelloch, C. C. Flanigan, *A time domain approach for spacecraft reanalysis*, AIAA Journal No. 92-2517-CP or in Christophe Berthod. Identification paramétrique de grandes structures: réanalyse et méthode évolutionnaire. Mécanique [physics.med-ph]. University of Franche-Comté, 1998. Nonetheless, this approximate method is based on a Rayleigh-Ritz procedure using a conventional or enriched modal base that leads to a system including a singular mass matrix. This singularity must be suppressed by using a time-consuming SVD type approach and the obtained result cannot be guaranteed.

Another method is described in the document: H. J.-P. Morand et al, Prévision de l'ambiance vibratoire des satellites, Tendances actuelles en calcul de structures, Bastia 6-7-8 Nov. 1985 (i.e., the MORAMD method). Nonetheless, this method has the same problems of singularity as the previous one because it integrates a projection on a conventional modal base and does not allow obtaining new vibratory responses on the launcher without repeating a conventional calculation for each new configuration.

SUMMARY

The present disclosure provides improved analysis methods implementing a reanalysis.

In particular, the present disclosure proposes an improvement to the original MORAND method presented in the introduction.

As such, the method of the present disclosure is based on the use of a reference vibratory ambient relating to a vehicle and a reference passenger obtained in a standard manner to obtain the vibratory ambient relating to the vehicle and to a new passenger.

For this purpose, a MORAND-type reanalysis method is implemented, the present disclosure advantageously implementing this method with a direct approach instead of a modal approach to determine the different operators.

The modal method used to calculate the operators in MORAND led to having a truncation which reduced the dimension of the reference system and subsequently induced singular matrices. The time saved by the MORAND method is based on the reduction of the dimension of the system to be solved (passage of the number of degrees of freedom of the reference system to the number of degrees of freedom of the vehicle/passenger interface) and is not linked to a modal formulation such as the Blelloch and Flanigan method. With this approach, it is then possible to reduce the size of the system without changing its dimension.

Also, to improve the MORAND method, the calculation of the different used operators is implemented in a direct way, and not by using a projection on a conventional modal. Thus, the present disclosure proposes, according to a first aspect, a method for determining by reanalysis of a vibratory ambient of a vehicle/passenger coupled system, the vehicle being subjected to external forces Fext and being coupled to a new passenger comprising x=1, N payload(s), at the level of the vehicle/passenger interfaces Ix.

The method comprising a step DET1) of determining, from the reference interfacial acceleration(s) $\gamma_{x_{ref}}$ of a reference passenger, interfacial acceleration(s) $\gamma_x'$ relating to the new passenger by means of the following relationship $$\gamma_x'(\omega) = \{I + M_{REF}^{TOT^{-1}}(\omega)\Delta M_x^P(\omega)\}^{-1} \gamma_{x_{ref}}(\omega)$$

with $\gamma_{x_{ref}}(\omega)$: vector of accelerations on all degrees of freedom of the vehicle/passenger interface for the reference passenger;

$\gamma_x'(\omega)$: vector of accelerations on all degrees of freedom of the vehicle/passenger interface for the new passenger;

$$\Delta M_x^P(\omega) = M_x^P(\omega) - M_{ref}^P(\omega);$$

$M_x^P(\omega)$: the interface dynamic mass operator of the new passenger;

$M_{ref}^P(\omega)$: the interface dynamic mass operator of the reference passenger;

$M_{REF}^{TOT}(\omega)$: the interface dynamic mass operator of the vehicle coupled to the reference passenger;

the operators $M_x^P(\omega)$, $M_{ref}^P(\omega)$ and $M_{REF}^{TOT}(\omega)$ being obtained by a direct approach in the following manner:

$$\frac{1}{-\omega^2} \begin{cases} (-\omega^2 M_{jj} + j\omega C_{jj} + K_{jj} + jH_{jj}) + \\ (-\omega^2 M_{ji} + j\omega C_{ji} + K_{ji} + jH_{ji}) \\ (-\omega^2 M_{ii} + j\omega C_{ii} + K_{ii} + jH_{ii})^{-1} \\ (\omega^2 M_{ij} + j\omega C_{ij} + K_{ij} + jH_{ij}) \end{cases}$$

M is the mass matrix of the reference passenger, the new passenger or the vehicle coupled to the reference passenger;

K is the stiffness matrix of the reference passenger, the new passenger or the vehicle coupled to the reference passenger;

C is the viscous damping matrix of the reference passenger, the new passenger or the vehicle coupled to the reference passenger;

H is the hysteretic damping matrix of the reference passenger, the new passenger or the vehicle coupled to the reference passenger; and I is the identity matrix.

The present disclosure is advantageously completed by the following features, considered alone or in any one of their technically possible combinations:

The method further comprises the following steps of

DET2) determining a first vibratory response of the vehicle alone, fixed in all degrees of freedom of the vehicle/passenger interface and subjected to the external forces Fext;

DET3) determining a second vibratory response $\gamma V_2$ of the vehicle subjected to the interfacial acceleration of the passenger;

DET4) determining from, the first and second vibratory responses ($\gamma V_1$, $\gamma V_2$) determined from the vibratory response of the vehicle subjected to external forces Fext and coupled to the passenger.

The determination of the second vibratory response of the vehicle is obtained from a linear combination of Nj vibratory responses $\gamma V_{2j}$ considered on each of the Nj degrees of freedom of the vehicle/passenger interface and the interfacial acceleration of the passenger as follows $$(\gamma V_2) = \sum_{j=1}^{j=N_j} \gamma V_{2j} * (\gamma'_x)_j$$

with $(\gamma_x')_j$ the interfacial acceleration on the degree of freedom j of the passenger obtained during step DET1).

The vibratory responses $\gamma V_{2j}$ of points of interest of the vehicle correspond to the vehicle alone subjected to a unitary interfacial acceleration $\gamma_j$ imposed on the interface degree of freedom j of the vehicle/passenger interface and equal to zero on the other degrees of freedom, Nj being the number of degrees of freedom of the vehicle/passenger interface.

The method comprises a step DET01) of determining, from a mechanical model of a reference passenger and from a mechanical model of a vehicle, a reference accelerometric field at the interface of the reference passenger coupled to said vehicle, subjected to the external forces Fext.

Step DET4 consists in summing the first and second vibratory responses.

The present disclosure also concerns, according to a second aspect, a processing unit configured to implement a method according to the present disclosure.

The use of a direct approach makes it possible to suppress the singularities.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIGS. 1a and 1b illustrate a passenger/vehicle coupled system;

In all the figures, similar elements have identical reference numerals.

Figure 2:
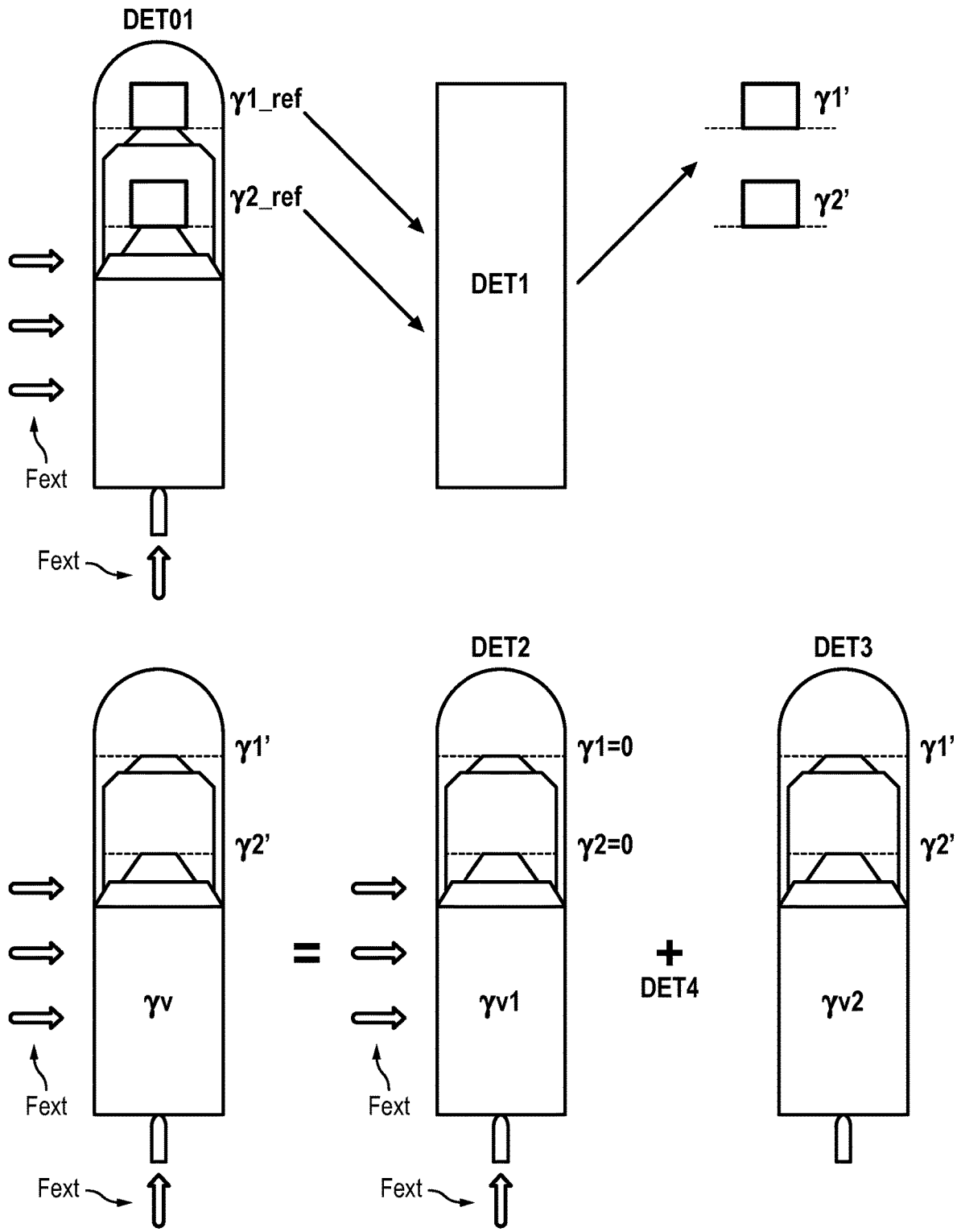
FIG. 2 illustrates steps of a method according to the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIGS. 1a and 1b illustrate a vehicle/passenger(s) coupled system. The "vehicle" is a launcher 1.

The term "Passenger" means the upper and lower payloads 2, 2' of FIGS. 1a and 1b.

In these figures, x=2 payloads are represented; they constitute the passenger. Of course, what will be described extends to N payloads with a rigid interface (the connection between the payload and the vehicle lies at one single point with 6 degrees of freedom) or flexible interface (the connection between the payload and the vehicle lies in several points with 6 degrees of freedom). Indeed, the concept of passenger must be considered in the broad sense: mechanical subassembly (joint or disjoint) connected to the vehicle by an interface I1, I2 . . . IN. Of course, the interface may be arbitrary. In practice, for a satellite, this interface is constituted by the adapter/payload connection.

It will be considered that the vehicle is subjected to external forces Fext. It is specified that the term external forces Fext means distributed forces (aerodynamic forces, gusts, buffeting, blast waves, etc.) and punctual forces (thrusts, switching on, switching off, separations, etc.). It will be noted that the external forces Fext apply only on the vehicle.

Referring to FIG. 2, a method for characterizing a vehicle/passenger coupled system will be described. Such a method is implemented in a processing unit (not represented).

The reference configuration illustrated in FIG. 2 and determined at a preliminary step DET01 will be considered.

According to this reference configuration, the reference vehicle/passenger coupled system is subjected to the external forces Fext.

The application of the external forces Fext on the vehicle leads to the reference acceleration field ($\gamma_{1_{ref}}, \gamma_{2_{ref}}$), it consists of the interfacial acceleration, that is to say the acceleration vector defined on all degrees of freedom of the vehicle/passenger interface.

The reference acceleration field ($\gamma_{1_{ref}}, \gamma_{2_{ref}}$) at the vehicle/passenger interface is determined by means of direct or modal methods in the time or frequency domain (O C Zienkiewicz, *The Finite Element Method: Its Basis and Fundamentals*, Elsevier, 7th edition, 2013). In any case, upon completion of the preliminary step DET01, the reference acceleration field ($\gamma_{1_{ref}}, \gamma_{2_{ref}}$) is expressed in the frequency domain. If the reference is in the time domain, it can be expressed in the frequency domain by means of a Fourier transform (FFT).

The objective of the method is to reuse the results obtained for the reference configuration in order to determine for new passengers their vibratory ambient but also that of the vehicle in the presence of these new passengers. Once the new results are obtained, if necessary, it will be possible to express them in the time domain by means of an inverse Fourier transform ($FFT^{-1}$).

At a first step DET1, from the results obtained on the reference configuration presented hereinabove, by means of a MORAND type reanalysis method with a direct approach, the vibratory ambient of the new passengers is determined, it consists of the acceleration field ($\gamma_1', \gamma_2'$) of FIG. 2.

The MORAND method is based on the existence of an equivalent force field $F^*(\omega)$ defined at the passenger interface which depends only on the dynamic characteristics of the vehicle and the external forces Fext. This equivalent force field is therefore strictly identical for the system with the reference passenger and the other passengers to be studied.

This acceleration field ($\gamma_1', \gamma_2'$) according to the MORAND method is obtained by means of the following relation:

$$\gamma_x'(\omega) = \{I + M_{REF}^{TOT^{-1}}(\omega)\Delta M_x^P(\omega)\}^{-1} \cdot \gamma_{x_{ref}}(\omega) \qquad \text{Eq. (0)}$$

with $x = \{1, 2\}$, but depends on the considered number of passengers (from 1 to N);

$\gamma_{x_{ref}}(\omega)$ is vector of accelerations on all degrees of freedom of the vehicle/passenger interface for the reference passenger;

$\gamma_x'(\omega)$ is vector of accelerations on all degrees of freedom of the vehicle/passenger interface for the new passenger;

$\Delta M_x^P(\omega) = M_x^P(\omega) - M_{ref}^P(\omega)$, with $M_x^P(\omega)$ being the interface dynamic mass operator of the new passenger and $M_{ref}^P(\omega)$ being the interface dynamic mass operator of the reference passenger (this may be zero);

$M_{REF}^{TOT}(\omega)$ is the interface dynamic mass operator of the vehicle coupled to the reference passenger; and I is the identity matrix.

Unlike the original MORAND method, the present disclosure does not calculate the operators used in the MORAND method by using a projection on a conventional modal base, but does it in a direct way.

The truncated projection has the effect of reducing the dimension of the reference system and leads, subsequently, to singular matrices.

Therefore, to overcome these singularities, the operators are calculated using a direct approach with the matrices as assembled. Nonetheless, it will be noted, that the direct approach has little effect on the calculation time since the concerned operators are calculated only once and that this avoids the calculation of a modal base. The saving in time of this method results from the size of the system to be solved for a new passenger: the number of degrees of freedom of the vehicle/passenger interface.

More specifically, considering a discretized numerical model in the frequency domain in the form:

$$-\omega^2[M]\{X\} + j\omega[C]\{X\} + [K]\{X\} + j[K]\{X\} = \{F\} \qquad \text{Eq. (1)}$$

with: [M] being a mass matrix of the reference passenger, a new passenger or the vehicle coupled to the reference passenger, [C] being a viscous damping matrix of the reference passenger, a new passenger or the vehicle coupled to the reference passenger, [K] being a stiffness matrix of the reference passenger, a new passenger or the vehicle coupled to the reference passenger, and [H] being the hysteretic damping matrix of the reference passenger, a new passenger or the vehicle coupled to the reference passenger.

The different degrees of freedom of the considered mechanical system are split into inner degrees of freedom (i) and physical degrees of freedom of interface (j). We then have:

$$\{X\} = \begin{Bmatrix} X_j \\ X_i \end{Bmatrix} \qquad \text{Eq. (2)}$$

The previous model is then expressed as follows:

$$-\omega^2 \begin{bmatrix} M_{jj} & M_{ji} \\ M_{ij} & M_{ii} \end{bmatrix} \begin{Bmatrix} X_j \\ X_i \end{Bmatrix} + \qquad \text{Eq. (3)}$$

$$j\omega \begin{bmatrix} C_{jj} & C_{ji} \\ C_{ij} & C_{ii} \end{bmatrix} \begin{Bmatrix} X_j \\ X_i \end{Bmatrix} + \begin{bmatrix} K_{jj} & K_{ji} \\ K_{ij} & K_{ii} \end{bmatrix} \begin{Bmatrix} X_j \\ X_i \end{Bmatrix} +$$

$$j \begin{bmatrix} H_{jj} & H_{ji} \\ H_{ij} & H_{ii} \end{bmatrix} \begin{Bmatrix} X_j \\ X_i \end{Bmatrix} = \begin{Bmatrix} F_j \\ 0 \end{Bmatrix}$$

By considering forces that only apply to the interface degrees of freedom, the second line of the equation hereinabove leads to:

$$-\omega^2 M_{ij} X_j - \omega^2 M_{ii} X_i + j\omega C_{ij} X_j + j\omega C_{ii} X_i + K_{ij} X_j + K_{ii} X_i + jH_{ij} X_j + jH_{ii} X_i = 0$$

Then $$X_i = (-\omega^2 M_{ii} + j\omega C_{ii} + K_{ii} + jH_{ii})^{-1}(\omega^2 M_{ij} - j\omega C_{ij} - K_{ij} - jH_{ij})X_j \qquad \text{Eq. (4)}$$

The first line of equation (3) leads to:

$$(-\omega^2 M_{jj} + j\omega C_{jj} + K_{jj} + jH_{jj})X_j + (-\omega^2 M_{ji} + j\omega C_{ji} + K_{ji} + jH_{ji})X_i = F_j \qquad \text{Eq. (5)}$$

And by using equation (4):

$$\{(-\omega^2 M_{jj} + j\omega C_{jj} + K_{jj} + jH_{jj}) +$$

$$(-\omega^2 M_{ji} + j\omega C_{ji} + K_{ji} + jH_{ji})(-\omega^2 M_{ii} + j\omega C_{ii} + K_{ii} + jH_{ii})^{-1}$$

$$(\omega^2 M_{ij} - j\omega C_{ij} - K_{ij} - jH_{ij})\}X_j = F_j \text{ or}$$

$$\{(-\omega^2 M_{jj} + j\omega C_{jj} + K_{jj} + jH_{jj}) + (-\omega^2 M_{ji} + j\omega C_{ji} + K_{ji} + jH_{ji})$$

$$(-\omega^2 M_{ii} + j\omega C_{ii} + K_{ii} + jH_{ii})^{-1}$$

$$(\omega^2 M_{ij} - j\omega C_{ij} - K_{ij} - jH_{ij})\}\frac{1}{-\omega^2}\ddot{X}_j = F_j$$

This equation is in the form $F_j = M(\omega)\gamma_j$. It relates the accelerations and the external forces at the interfaces of the system via the interface dynamic mass operator $M(\omega)$.

We thus obtain $M(\omega) =$ $$\frac{1}{-\omega^2} \begin{Bmatrix} (-\omega^2 M_{jj} + j\omega C_{jj} + K_{jj} + jH_{jj}) + \\ (-\omega^2 M_{ji} + j\omega C_{ji} + K_{ji} + jH_{ji}) \\ (-\omega^2 M_{ii} + j\omega C_{ii} + K_{ii} + jH_{ii})^{-1} \\ (\omega^2 M_{ij} + j\omega C_{ij} + K_{ij} + jH_{ij}) \end{Bmatrix} \qquad \text{Eq. (6)}$$

Equation (6) is used to directly determine all dynamic mass operators in equation (0).

According to the MORAND method, although the equivalent force field F*(ω) is strictly identical for the system with the reference passenger and the other passengers to be studied, this equivalent force field F*(ω) guarantees the equivalence only at the level of the passenger interface. As a result, the vibratory responses are exact at the level of the passengers but not inside the vehicle.

To overcome this limitation, it is possible to use the superposition principle as illustrated in FIG. 2.

According to this decomposition:

the first term on the right corresponds to the response of the vehicle alone (γV1) subjected to the external forces Fext, the vehicle/passenger interface being fixed (the accelerations are zero);

the second term on the right corresponds to the response of the vehicle alone (γV2) subjected to the interface acceleration field ($\gamma_1'$,$\gamma_2'$) of the new passenger determined at step DET1.

It is advantageous to notice that the first term does not depend on the passengers.

Thus, to obtain the response of the vehicle γV subjected to the external forces Fext in the presence of a new passenger, it is necessary to proceed with two separate calculations:

a calculation (step DET2) of a first response (γV1) of the vehicle alone subjected to the external forces Fext, the vehicle/passenger interface being fixed;

a calculation (step DET3) of the response (γV2) of the vehicle alone subjected to the interface acceleration field ($\gamma_1'$,$\gamma_2'$) of the new passenger.

Once the responses (γV1) and (γV2) have been obtained, all it needs is to sum them (step DET4) to obtain the pursued response of the vehicle γV.

The reanalysis step DET1 according to the MORAND method with a direct approach is quick but the calculation of step DET3 is heavier because it is performed for each new passenger. It is indeed a conventional response calculation that makes this reanalysis method useless if one wishes to obtain responses on the vehicle.

In one form, in order to improve the calculation at step DET3, the level of the vehicle/passenger interface the number of degrees of freedom Nj is much lower than the number of configurations Np relating to a passenger. Thus, we have Nj<<Np.

Furthermore, it is considered that the application of a unitary interfacial acceleration $\gamma_j$ imposed on the interface degree of freedom j of the vehicle/passenger interface and equal to zero on the others which leads to the response fields ($\gamma V_{2j}$) at several points of interest inside the vehicle. There are Nj responses of this type, Nj being the number of degrees of freedom of the vehicle/passenger interface.

The determination of (γV1) and Nj ($\gamma V_{2j}$) can be carried out during the preliminary phase DET01 since these responses do not depend on the new passenger.

In this way, step DET3 is carried out by determining the response of the vehicle (γV2) from a linear combination of the Nj vibratory responses ($\gamma V_{2j}$) and the interfacial acceleration ($\gamma_1'$,$\gamma_2'$) of the passenger determined at step DET1. The linear combination is defined as follows: $(\gamma V_2) = \sum_{j=1}^{j=N_j} \gamma V_{2j} * (\gamma_1', \gamma_2')_j$.

Figure 3:
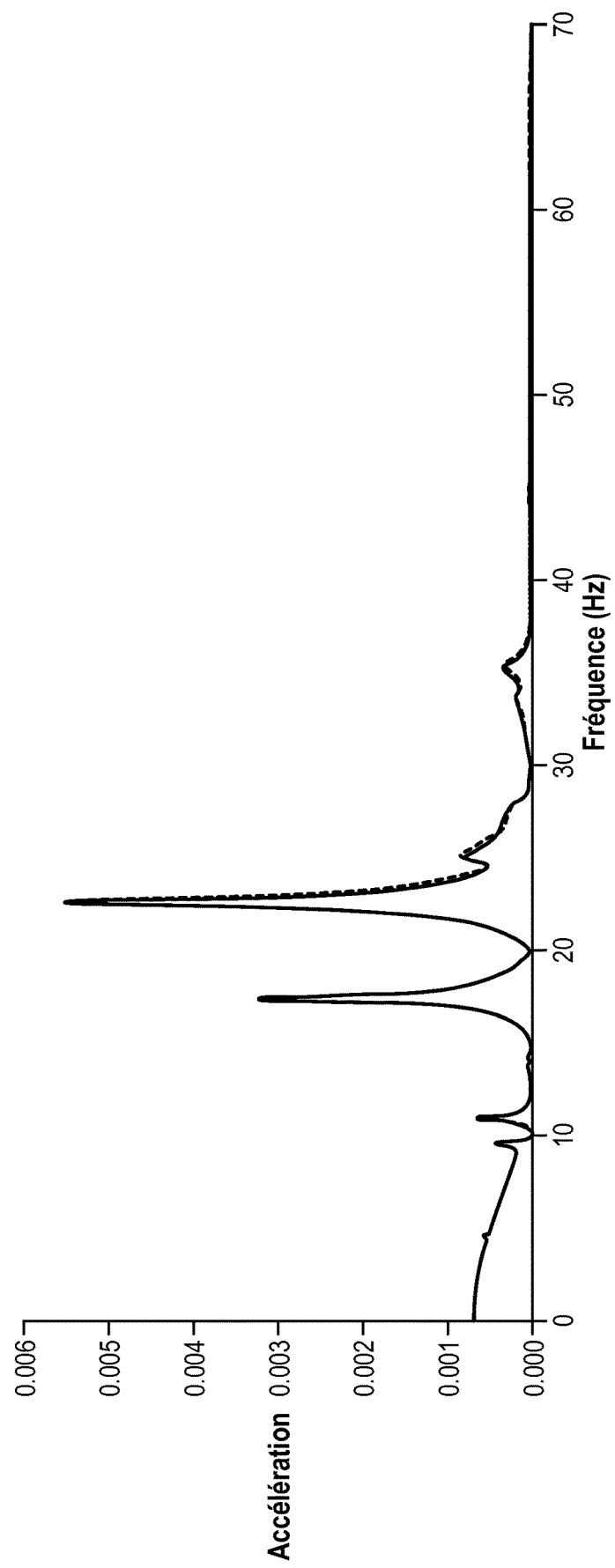
FIG. 3 illustrates curves of dynamic responses at a passenger/vehicle interface according to the present disclosure.

The method of the present disclosure has been implemented and tested. FIG. 3 illustrates the result of these tests.

The solid line curve represents in the frequency domain the dynamic response at the vehicle/passenger interface calculated according to the conventional method and the dashed line curve represents the dynamic response at the vehicle/passenger interface calculated according to the method of the present disclosure (MORAND with direct approach).

It is immediately noticed that these curves are identical which validates the method of the present disclosure.

Furthermore, the calculation time to obtain this response according to the conventional method is about 30 minutes while with the method of the present disclosure the calculation time is about 20 s. The time saving is considerable.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice; material, manufacturing, and assembly tolerances; and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A computer implemented method for controlling a mechanical compatibility between a passenger and a vehicle, by determining, by reanalysis, a vibratory ambient of a coupled system including the vehicle and the passenger, the vehicle being subjected to external forces Fext and being coupled to a new passenger comprising x=1, . . . , N payload(s), at vehicle/passenger interfaces Ix, the method comprising the following steps:

DET 01) determining a reference accelerometric field yx_ref=($y_{1\_ref}$, $y_{2\_ref}$) at a vehicle/passenger interface of a reference passenger coupled to the vehicle, wherein the reference accelerometric field is determined based on a mechanical model of the reference passenger and a mechanical model of the vehicle; and DET 1) determining an interfacial acceleration relating to the new passenger different from the reference passenger based on the reference accelerometric field $y_{x\_ref}$ and the following relationship:

$$\gamma Y'_x(\omega) = \{I + M_{REF}^{TOT^{-1}}(\omega) \Delta M_x^P(\omega)\}^{-1} \cdot \gamma_{x_{ref}}(\omega)$$

with $y_{xref}(\omega)$ being vector of accelerations on all degrees of freedom of the vehicle/passenger interface for the reference passenger;

Y'x(ω) being vector of accelerations on all degrees of freedom of the vehicle/passenger interface for the new passenger;

$\Delta M_x^P(\omega) = M_x^P(\omega) - M_{ref}^P(\omega)$ with $M^P{}_x(\omega)$ being the interface dynamic mass operator of the new passenger;

$M^P{}_{ref(\omega)}$ being the interface dynamic mass operator of the reference passenger; and $M_{REF}^{TOT}(\omega)$ being the interface dynamic mass operator of the vehicle coupled to the reference passenger; and the operators $M_x^P(\omega)$, $M^P{}_{ref(\omega)}$ and $M_{REF}^{TOT}(\omega)$ being obtained by a direct approach in the following manner:

$$M(\omega) = \frac{1}{-\omega^2} \begin{Bmatrix} (-\omega^2 M_{jj} + j\omega C_{jj} + K_{jj} + jH_{jj}) + \\ (-\omega^2 M_{ji} + j\omega C_{ji} + K_{ji} + jH_{ji}) \\ (-\omega^2 M_{ii} + j\omega C_{ii} + K_{ii} + jH_{ii})^{-1} \\ (\omega^2 M_{ij} + j\omega C_{ij} + K_{ij} + jH_{ij}) \end{Bmatrix}$$

where

M is the mass matrix of the reference passenger, the new passenger, or the vehicle coupled to the reference passenger;

K is the stiffness matrix of the reference passenger, the new passenger, or the vehicle coupled to the reference passenger;

C is the viscous damping matrix of the reference passenger, the new passenger, or the vehicle coupled to the reference passenger;

H is the hysteretic damping matrix of the reference passenger, the new passenger, or the vehicle coupled to the reference passenger; and I is the identity matrix.

2. The method according to claim 1 further comprising the following steps:

DET2) determining a first vibratory response ($yV_1$) of the vehicle alone, fixed in all degrees of freedom of the vehicle/passenger interface and subjected to the external forces Fext;

DET3) determining a second vibratory response $yV_2$ of the vehicle subjected to the interfacial acceleration ($y'_1$, $y'_2$) of the new passenger; and DET4) determining a pursued response of the vehicle based on the first and second vibratory responses ($yV_1$, $yV_2$) determined from the vibratory response ($yV$) of the vehicle subjected to external forces Fext and coupled to the new passenger.

3. The method according to claim 2, wherein the determination of the second vibratory response of the vehicle is obtained from a linear combination of Nj vibratory responses $yV_{2j}$ considered on each of the Nj degrees of freedom of the vehicle/passenger interface and the interfacial acceleration of the new passenger as follows $$(\gamma V_2) = \sum_{j=1}^{j=N_j} \gamma V_{2j} * (\gamma'_x)_j$$

with $(y'_x)_j$ the interfacial acceleration on the degree of freedom j of the new passenger obtained during the step DET1).

4. The method according to claim 3, wherein the vibratory responses $yV_{2j}$ of points of interest of the vehicle correspond to the vehicle alone subjected to a unitary interfacial acceleration $y_i$ imposed on the interface degree of freedom j of the vehicle/passenger interface and equal to zero on the other degrees of freedom, Nj being the number of degrees of freedom of the vehicle/passenger interface.

5. The method according to claim 1 further comprising a step DET01 of determining, from a mechanical model of a reference passenger and from a mechanical model of a vehicle, a reference accelerometric field ($y_{1ref}, y_{2ref}$) at the interface of the reference passenger coupled to said vehicle, subjected to the external forces Fext.

6. The method according to claim 2, wherein the step DET4) includes summing the first and second vibratory responses.

7. A processing unit comprising a processor configured to implement the method according to claim 1.

* * * * *